(12) United States Patent
Gao

(10) Patent No.: US 11,445,638 B2
(45) Date of Patent: Sep. 13, 2022

(54) SYSTEM AND METHOD FOR MANAGING AIRFLOW IN A DATA CENTER

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 17/013,014

(22) Filed: Sep. 4, 2020

(65) Prior Publication Data
US 2022/0078945 A1    Mar. 10, 2022

(51) Int. Cl.
H05K 7/20      (2006.01)

(52) U.S. Cl.
CPC ....... H05K 7/20745 (2013.01); H05K 7/2079 (2013.01); H05K 7/20727 (2013.01); H05K 7/20772 (2013.01)

(58) Field of Classification Search
CPC . H05K 7/20718–20745; H05K 7/20763–2079
See application file for complete search history.

(56) References Cited

U.S. PATENT DOCUMENTS

| | | | | |
|---|---|---|---|---|
| 8,472,182 B2* | 6/2013 | Campbell | .......... | H05K 7/20781 361/679.49 |
| 9,007,221 B2* | 4/2015 | Zeighami | .......... | H05K 7/20727 340/605 |
| 9,560,794 B2* | 1/2017 | Sato | .......... | G06F 1/20 |
| 10,448,543 B2* | 10/2019 | Farshchian | .......... | H05K 7/2029 |
| 2014/0352923 A1* | 12/2014 | Chang | ................ | H05K 7/20745 165/104.21 |
| 2016/0014933 A1* | 1/2016 | Matsunaga | ........ | H05K 7/20818 361/679.53 |
| 2019/0075684 A1* | 3/2019 | Magarelli | .......... | H05K 7/20745 |

FOREIGN PATENT DOCUMENTS

| | | | |
|---|---|---|---|
| JP | 2010257431 A | * | 11/2010 |
| JP | 2013008888 A | * | 1/2013 |
| JP | 2014191783 A | * | 10/2014 |

* cited by examiner

*Primary Examiner* — Zachary Pape
(74) *Attorney, Agent, or Firm* — Womble Bond Dickinson (US) LLP

(57) ABSTRACT

Described herein is an airflow management system and method. The system includes a top layer and a bottom layer, and each of the layers has a dedicated air flow management and hardware system that are operated independently. The top layer is a drop ceiling air plenum, and can store fan coils arranged in a hot aisle containment fashion or a cold hair containment fashion. The top layer receives fresh air from its own air source, and exhausts hot air through its own exhaust. The bottom layer can include server racks arranged in a hot aisle containment fashion or a cold aisle containment fashion. One or more servers in the bottom layer can include an air cooling component and a liquid cooling component, and receive cooling liquid from the top layer and receives cooling air from its own air source.

14 Claims, 8 Drawing Sheets

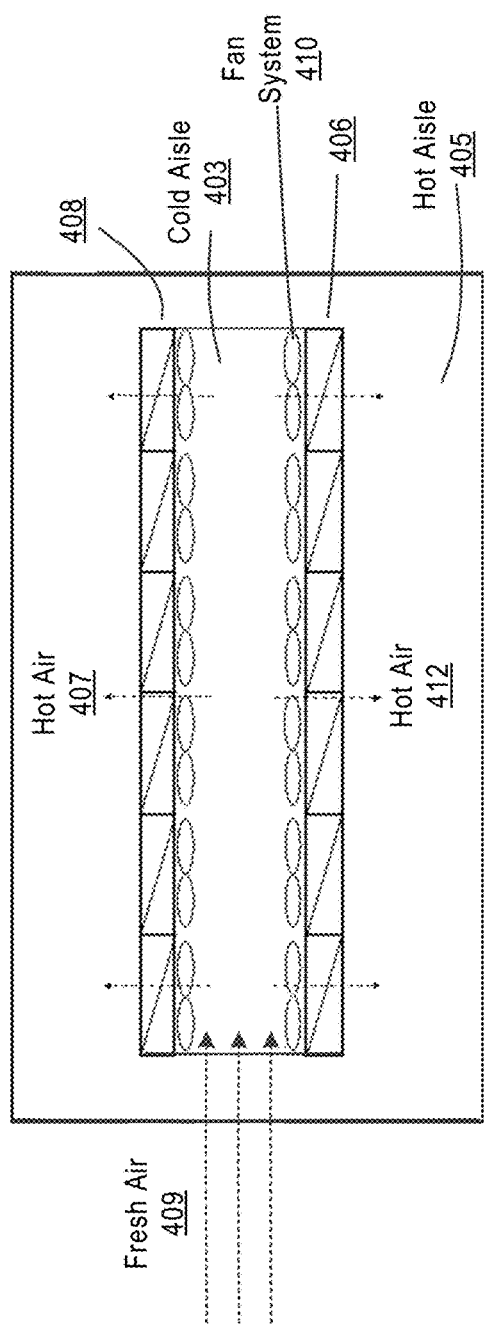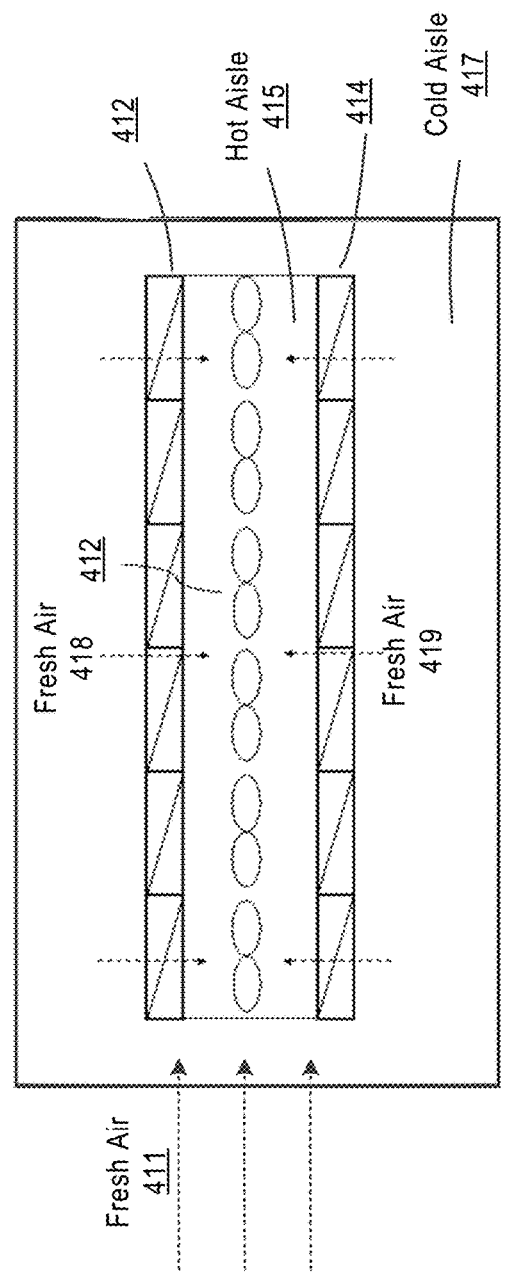

SYSTEM AND METHOD FOR MANAGING AIRFLOW IN A DATA CENTER

FIELD OF THE INVENTION

Embodiments of the present disclosure relate generally to airflow management in a data center. More particularly, embodiments of the disclosure relate to a hybrid and modularized approach to managing airflow management in a data center.

BACKGROUND

With the booming of AI applications, cloud computing and data-driven applications, data centers have becoming increasingly critical for a company to maintain its competitive edges. Maintaining a data center is expensive and part of the expenses is related to cooling the data center.

A modern data center often includes servers with different lifetimes, and therefore requires frequent upgrading to cooling systems to meet the cooling needs. Further, a modern data center often uses a single air source, which may not be the most efficient cooling solution for all types of IT equipment or infrastructure. In addition, a modern data center typically only uses recirculated cooling air, whose quality may be much better than natural fresh air. Natural fresh air, whose quality is typically bad in some areas, can damage the electronics in the data center.

Therefore, a flexible, resilient, modularized, and hybrid cooling approach utilizing multiple air sources would reduce the cooling cost of a data center by increasing the cooling efficiency, as well as reducing the capital cost.

BRIEF DESCRIPTION OF THE DRAWINGS

Embodiments of the invention are illustrated by way of example and not limitation in the figures of the accompanying drawings in which like references indicate similar elements.

FIGS. 4A-4B illustrate top views of designs of the top layer according to various embodiments.

DETAILED DESCRIPTION

Figure 1:
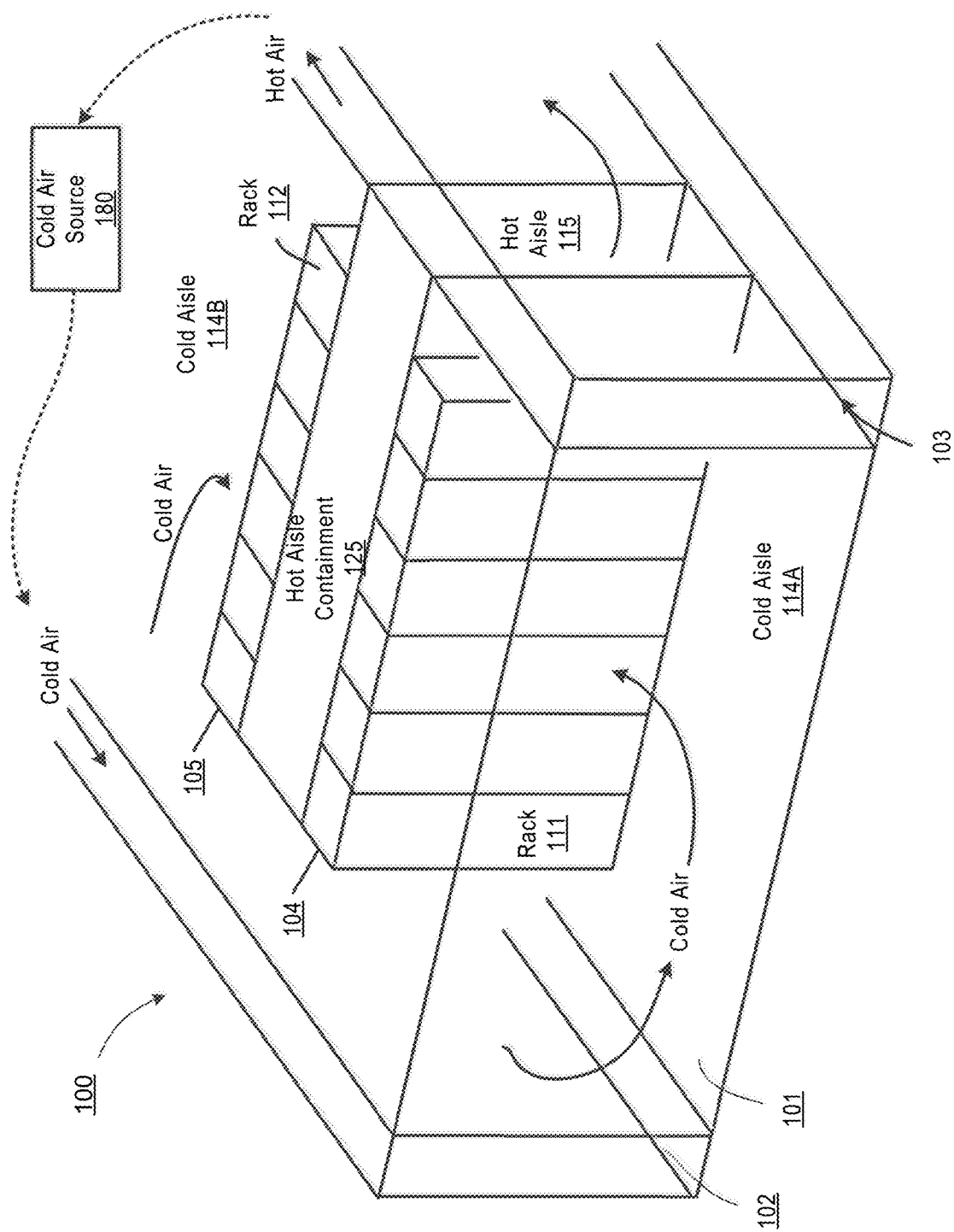
FIG. 1 shows a perspective view of a data center system according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to various embodiment, described herein are systems and methods for managing airflow in a data center. In one embodiment, the system includes a top layer and a bottom layer. The top layer is a drop ceiling air plenum, and can store fan coils arranged in a hot aisle containment fashion or a cold hair containment fashion. The top layer receives fresh air from its own air source, and exhausts hot air through its own exhaust. The bottom layer can include server racks arranged in a hot aisle containment fashion or a cold aisle containment fashion. One or more servers in the bottom layer can include an air cooling component and a liquid cooling component, and receive and circulate cooling liquid from the top layer and receives cooling air from its own air source, and exhaust the air through its own exhaust.

The embodiments provide cost-effective architecture for managing airflow to cool a high density IT cluster in a data center. In one embodiment, an airflow management system can include different types of IT equipment, including liquid cooling IT equipment and air-cooled IT equipment. Further, the system can enable more accurate air distribution based on load to be cooled and air temperature and quality outside of the data center. Further, the various embodiments in this disclosure provide an architecture for deploying upgraded IT equipment cooled in a hybrid manner into a pure air cooled infrastructure, and can be used for designing cooling solutions for new IT clusters. They can also be used for upgrading or reconfiguring existing IT clusters, data center rooms, or PoD such that they can continue to support new IT equipment.

In one embodiment, the fan coils in the top layer can be used to recirculate cooling fluid from the top layer to the server racks in the bottom layer. The server racks can receive the cooling fluid from the top layer, and distribute the cooling fluid to liquid cooling server loops in the server racks. Hot fluid from the server racks is then pumped back to the top layer to the fan coils. Pumps used for the pumping of the fluid can be installed in either layer. The fan coils in the top layer can be arranged in a cold aisle containment fashion or a hot aisle containment fashion.

In one embodiment, the top layer includes a cooling unit for cooling fresh air directly drawn from the outside of the data center, for use in cooling the fan coils the top layer. The bottom layer includes an air source specific to the second layer, which is a room air cooling unit that can be used to recirculate internal data center air through electronic racks in the bottom layer.

In one embodiment, the airflow management system includes a fresh air cooling system that attached to both the top layer and the bottom layer. The fresh air cooling system includes a fresh air intake, a fan wall, and a cooling air chamber; and can be configured to generate different pressures within the chamber to supply different amounts of air to the top layer and the bottom layer.

In one embodiment, the bottom layer includes a chilled water system and a computer room air handler (CRAH) unit. The chilled water system can supply chilled water to the CRAH unit. In one embodiment, different types of cooling architecture and cooling equipment can be integrated into the bottom layer structure for the airflow recirculation and conditioning.

FIG. 1 shows a perspective view of a data center system according to one embodiment. Referring to FIG. 1, data center system 100 includes an IT room 101, a cold air room 102, and a hot air room 103. IT room 101 includes a number of electronic racks such as electronic racks 111-112. Each electronic rack contains one or more IT components arranged in a stack. An IT component can be a computer server providing data services to clients. Alternatively, an IT component can be a peripheral device or a network appliance device such as cloud storage systems. Each IT component may include one or more processors, memory, and/or a storage device that may generate heat during operations. The electronic racks are arranged in a number of rows of electronic racks, in this example, rows 104-105 of electronic racks. The rows of electronic racks are arranged spaced apart to form one or more cold aisles and one or more hot aisles. In this embodiment, although there are only two rows 104-105 of electronic racks shown, there can be more rows to be contained in IT room 101.

In one embodiment, each row of electronic racks is positioned or sandwiched between a cold aisle and a hot aisle. In this example, row 104 and row 105 are positioned apart from each other to form cold aisle 114A, hot aisle 115, and cold aisle 114B. Hot aisle 115 is formed between row 104 and row 105. Row 104 is positioned or sandwiched between cold aisle 114A and hot aisle 115, while row 105 is positioned or sandwiched between cold aisle 114B and hot aisle 115. In one embodiment, hot aisle 115 is contained or enclosed by hot aisle containment (or container or other enclosures). In another embodiment, the cold aisles are contained in a containment environment instead of the hot aisles. In a further embodiment, both hot aisles and cold aisles are contained in an enclosed environment. In one embodiment, the backend of the electronic racks of rows 104-105 are facing hot aisle 115, while the frontends of the electronic racks are facing cold aisle 114A or cold aisle 114B and away from hot aisle 115.

In one embodiment, cold air room 102 is located and adjacent to a first side of IT room 101, while hot air room 103 is located and adjacent to a second side of IT room 101. In this example, the first side and the second side are opposite sides of IT room 101. Cold air room 102 is configured to receive cold air or cool air via one or more inlet ports from a cold air source such as cold air source 180. The cold air is allowed to enter IT room 101 from cold air room 102 via one or more openings disposed on the wall between cold air room and IT room 101 (not shown). The cold air entering IT room 101 to form cold aisles 114A-114B.

Hot air room 103 is configured to exhaust the hot air from hot aisle 115 and return the hot air or warmer air back to the cold air source for heat exchange. Note that cold air source 180 can include a heat exchanger or chiller. For example, cold air source 180 can be an IDEC system or device. Alternatively, cold air source 115 can simply be the natural ambient air outside of the data center system 100.

In one embodiment, both the cold air room 102 and the hot air room 103 may be directly connected to the ambient, which enables both rooms 102 and 103 to directly draw fresh air from the outside and directly exhaust to the outside. An evaporative cooler is a device that cools air through the evaporation of water. Evaporative cooling differs from typical air conditioning systems, which use vapor compression or absorption refrigeration cycles. Evaporative cooling works by exploiting water's large enthalpy of vaporization. The temperature of dry air can be dropped significantly through the phase transition of liquid water to water vapor evaporation). Indirect evaporative cooling is used to lower the temperature and increase the humidity of air by using latent heat of evaporation, changing liquid water to water vapor. In this process, the energy in the air does not change. Warm dry air is changed to cool moist air. The heat of the outside air is used to evaporate water. Indirect evaporative cooling is a cooling process that uses direct evaporative cooling in addition to some type of heat exchanger to transfer the cool energy to the supply air. The cooled moist air from the indirect evaporative cooling process never comes in direct contact with the conditioned supply air.

Referring back to FIG. 1, in this example, the cold air is received from one or more inlets or inlet ports disposed on a wall of cold air room 102, where the wall is substantially parallel with a third side of IT room 101. The third side of IT room 101 is substantially perpendicular to the first side and the second side, while the first side and the second side are substantially parallel to each other. Similarly, the hot air is exhausted from hot air room 103 to the external environment or back to cold air source 180 via one or more outlets or outlet ports disposed on a wall of hot air room 102, where the wall is substantially parallel with the third side of IT room 101.

According to one embodiment, hot aisle 115 is enclosed or contained within hot aisle containment 120, such that the hot air cannot escape or spill from hot aisle 115 into other areas of IT room 101 such as cold aisles 114A-114B. Instead, the hot aisle enters hot air room 103 from hot aisle via one or more openings (e.g., windows, doors) disposed on a wall between hot aisle 115 and hot air room 103. In one embodiment, the openings allow an operator or a user to enter hot aisle 115 from hot air room 103 to access the backend of the electronic racks, for example for maintenance services. Doors are needed on the 102 and 103, for operators to be able to enter cold air room 102 and hot air room 103. And no door is needed on hot aisle 115, and doors are needed on the walls between cold air room 102 and IT room 101, according to some embodiments.

Similarly, the openings disposed on the wall between cold air room 102 and IT room 101 may include one or more doors to allow an operator or user to enter cold aisles 114A-114B from cold air room 102. As a result, entering or leaving cold aisles or hot aisles would not have a significant impact on the cold air distribution and hot air exhaustion. That is, entering or leaving hot aisle 115 would not alter cold air distribution for cold aisles 114A-114B, because hot aisle 115 is separated from cold aisles 114A-114B and the rest of IT room 101 by hot aisle containment 120. Similarly, entering or leaving cold aisles 114A-114B would not affect hot air exhaustion of hot aisle 115, since opening a door for a user to enter or leave would not mix the cold air and the hot air.

In one embodiment, the data center architecture described in FIG. 1 can be used as the bottom layer 203 of the airflow management system described in FIGS. 2-3, and 5-7. The cold aisle containment and hot aisle containment layout can be extended to the top layer 201 in FIGS. 2-3 and 5-7.

Figure 2:
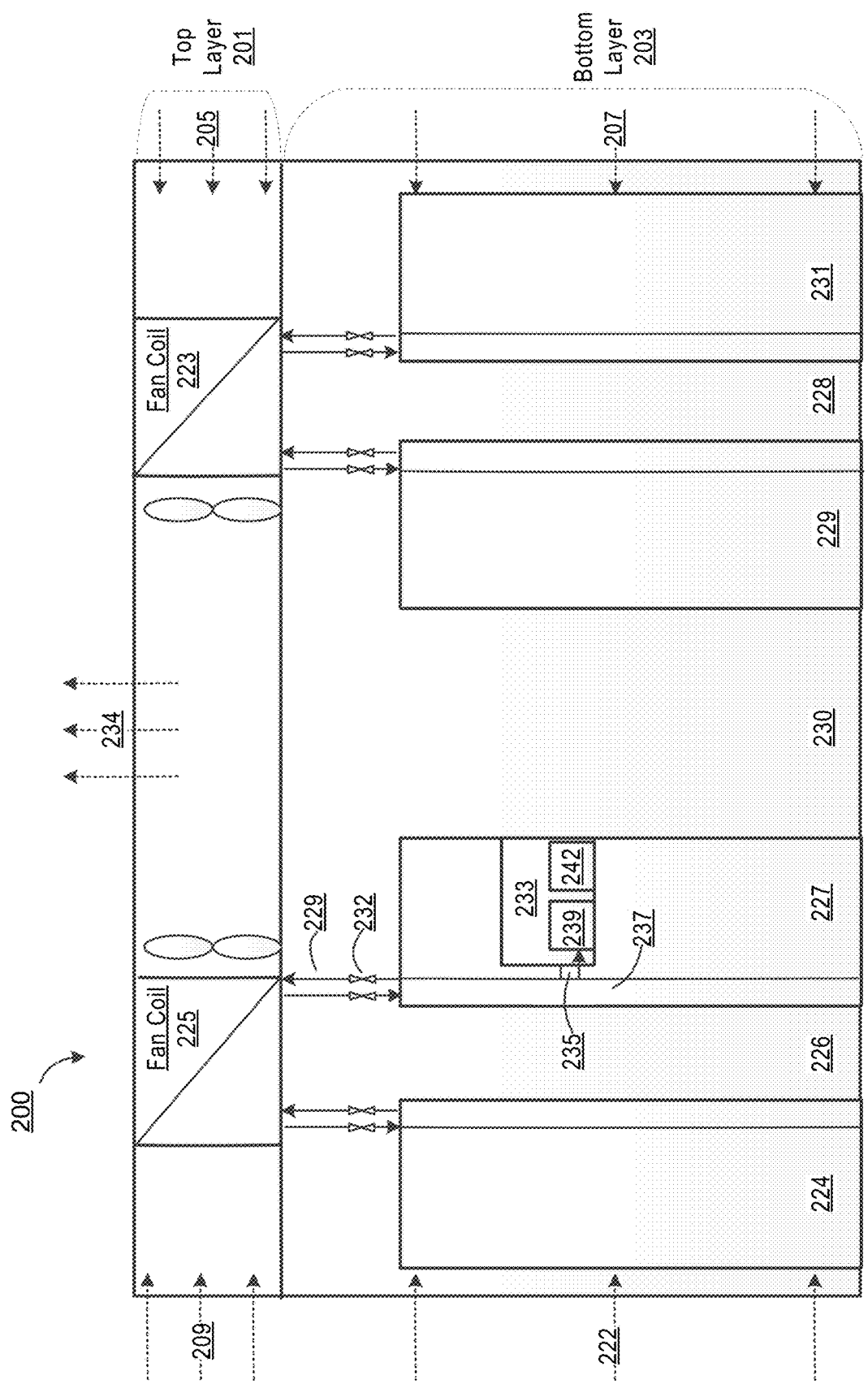
FIG. 2 shows a side view of an airflow management system according to one embodiment.

FIG. 2 shows a side view of an airflow management system 100 according to one embodiment. As shown in FIG. 1, the airflow management system 100 includes a top layer 201 and a bottom 203. The top layer is a drop ceiling air plenum, which includes a number of fan coils, for example, fan coils 223 and 225. Each fan coil operates as an air to liquid heat exchanger. An air source inlet 205 and 209 can be used to supply fresh air to a cooling unit (not shown) to cool the top layer, which has its own hot air exhaust 234.

In one embodiment, the bottom layer 203 is an IT region, where a number of electronic racks (also referred to as server racks) are arranged in different manners, such as a cold aisle containment fashion or a hot aisle containment fashion, which is described in detail in FIG. 1. As shown in FIG. 2, the bottom layer 203 incudes 4 rows of electronic racks 224, 227, 229 and 231, which form two cold aisles 226 and 228, and one hot aisle 230. In another embodiment, the four rows of electronic racks 224, 227, 229, and 231 may form two hot aisles 226 and 228, and one cold aisle 230. The detailed structure of either a hot aisle containment or cold aisle containment is not shown in FIG. 2. The bottom layer 203 can have its dedicated air source inlet 222 and 207 for supplying cooling air, and can have its own hot air return (not shown in this figure). The reference numbers 205 and 209 represent different sections of the same air source inlet, and the reference numbers 222 and 207 represents different section of another air source inlet.

In one embodiment, each cold aisle in the bottom layer 203 can correspond to a fan coil in the top layer 201. For example, the cold aisle 226 corresponds to the fan coil 225, and the cold aisle 228 corresponds to the fan coil 223. Each electronic rack can have similar cooling components, and can connect to the top layer 201 in a similar manner. FIG. 2 uses the electronic rack 227 to illustrate the cooling components and the connection mechanism. In another embodiment, the fan coils can be two separate units 225 and 223.

In one embodiment, the electronic rack 227 can contain a number of servers. This figure uses server 233 as an example to illustrate cooling components within each server. As shown, the server 233 can include a liquid cooling component 239 and an air cooling component 242. A rack liquid distribution unit 237 on the electronic track 227 can receive cooling liquid from the top layer 201 using a liquid loop 229 through liquid connectors 232, and can distribute the received cooling liquid to the liquid cooling component 239 within the server in the electronic track 227 through a fluid loop and connection unit 235. The air cooling component 242 can be cooled using cooling air supplied by the air source inlet 222 and 207.

Therefore, the server 233 can be cooled in a hybrid manner, and can be cooled simultaneously by cooling air and cooling liquid. Cooling fluid is circulated between the liquid cooling component 239 and the fan coil 225 through the fluid loop and connection unit 235 and the liquid loop 229.

Figure 3:
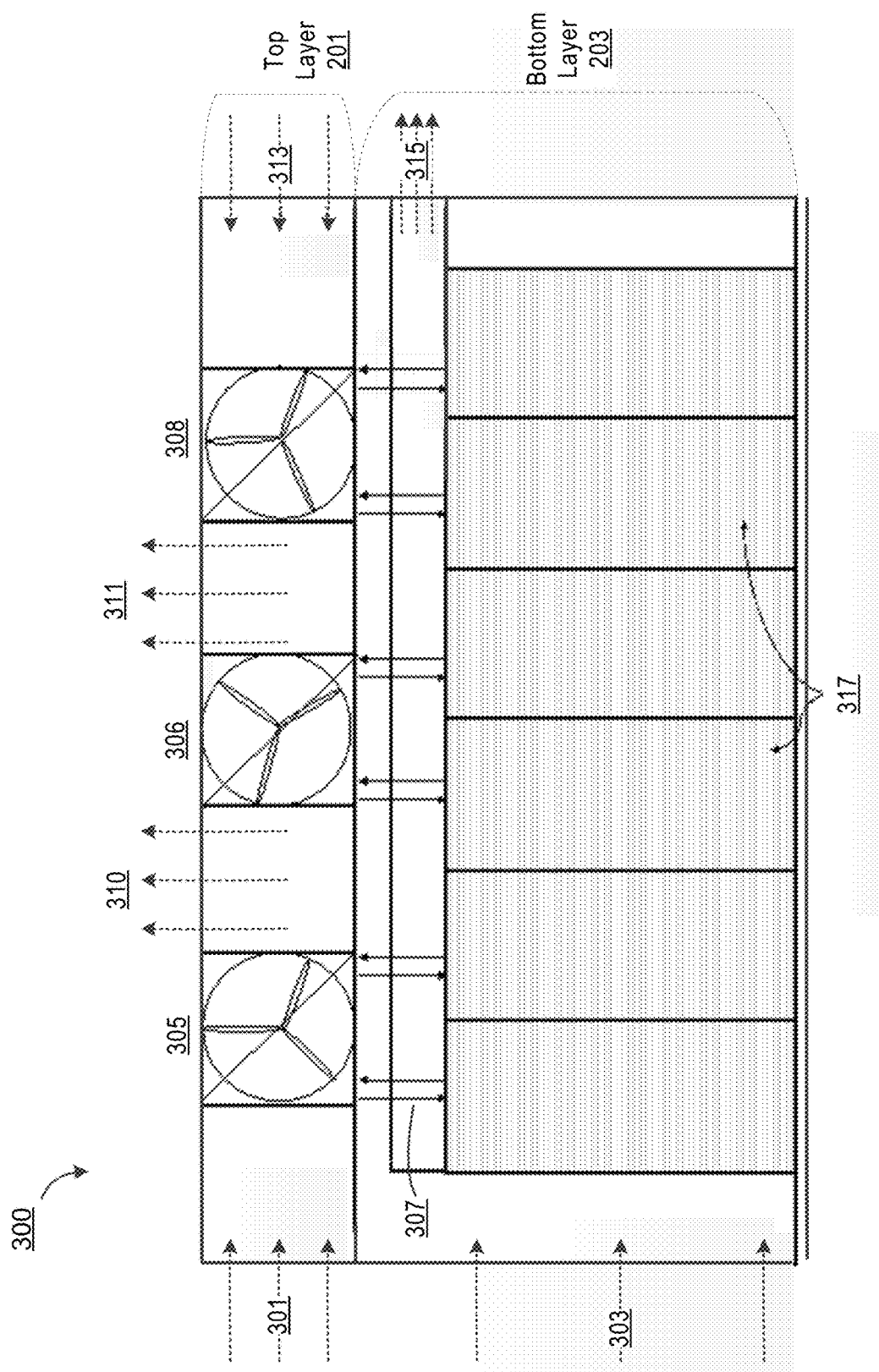
FIG. 3 shows another side view of the airflow management system according to one embodiment.

FIG. 3 shows another side view of the airflow management system 100 according to one embodiment. This view also shows a side view of the data center system from a different side. As previously described, components in the top layer 201 and the bottom layer 203 are separately arranged, and are connected only through the liquid loops 307 and liquid connectors (not shown). A pumping system (not shown) can be used to pump cooling liquid into the liquid loops 307. A hot air return 315 can be implemented using a ducting. The electronic tracks 317 in the bottom layer 203 are the same electronic tracks in FIG. 2. An air source inlet 303 can be used to supply cooling air to the bottom layer 203. The air source inlet 303 can be a different section of the air source inlet 222 and 207.

From the view represented in FIG. 3, the top layer 201 can include multiple fan coils 305, 306, and 308, and multiple hot air exhausts 310 and 311. An air source inlet 301 and 313 can be the same air source inlet 209 and 225 used to supply fresh air into the top layer 201. The air source inlet 301 and 313 is used to supply cooling air to the cold aisle of the top layer 201, and the hot air exhausts 310 and 311 are the exhaust side connected with the hot aisle of the top layer 201.

In one embodiment, the air source inlet 301 and 313 and the air source inlet 303 are two separate and also different cooling sources. Alternatively, each of the reference numbers 301, 303, and 313 can be a different air source. The air source inlet 301 and 303 can draw fresh outside air, and the air source inlet 303 can draw internal data center recirculated cooling air. Each air source inlet has its own air exhaust. The reference numbers 303 and 301 can be two different parts of the same air source that has been partitioned based on cooling need.

FIGS. 4A-4B illustrate top views of designs of the top layer 201 according to various embodiments.

In FIG. 4A, fan coils in the top layer are arranged in two rows 406 and 408 are arranged in a cold aisle containment fashion, similar to the manner that the electronic racks in the bottom layer 203 in FIG. 2 are arranged. Fresh air 409 can enter a cold aisle 403 formed by the two rows of electronic racks 406 and 408. A fan system 410 can be optionally used to pump the airflow. Hot air 407 and 412 can be discharge from the fan coils into a hot aisle 405 or the ambient. Fans in the fan system 410 can be controlled individually or operated at a set speed.

In FIG. 4B, fan coils are arranged in a hot aisle containment fashion. In this embodiment, the entire top layer region is in a cold aisle 417. Fresh air 411, 418, and 419 can be supplied to the top layer 201, and then can be pumped into a hot aisle 415 to cool fan coils there. Discharge fans 412 can be used to exhaust the hot air to the outside. The ceiling hot exhaust, such the hot air exhaust 234 in FIG. 2, is directly connected to the hot aisle over the top.

In one embodiment, the fan system 410 in Figure described in 4A can be used in the embodiment described in 4B. Similarly, the discharge fans 412 in FIG. 4B can be used in the embodiment described in 4A.

Figure 5:
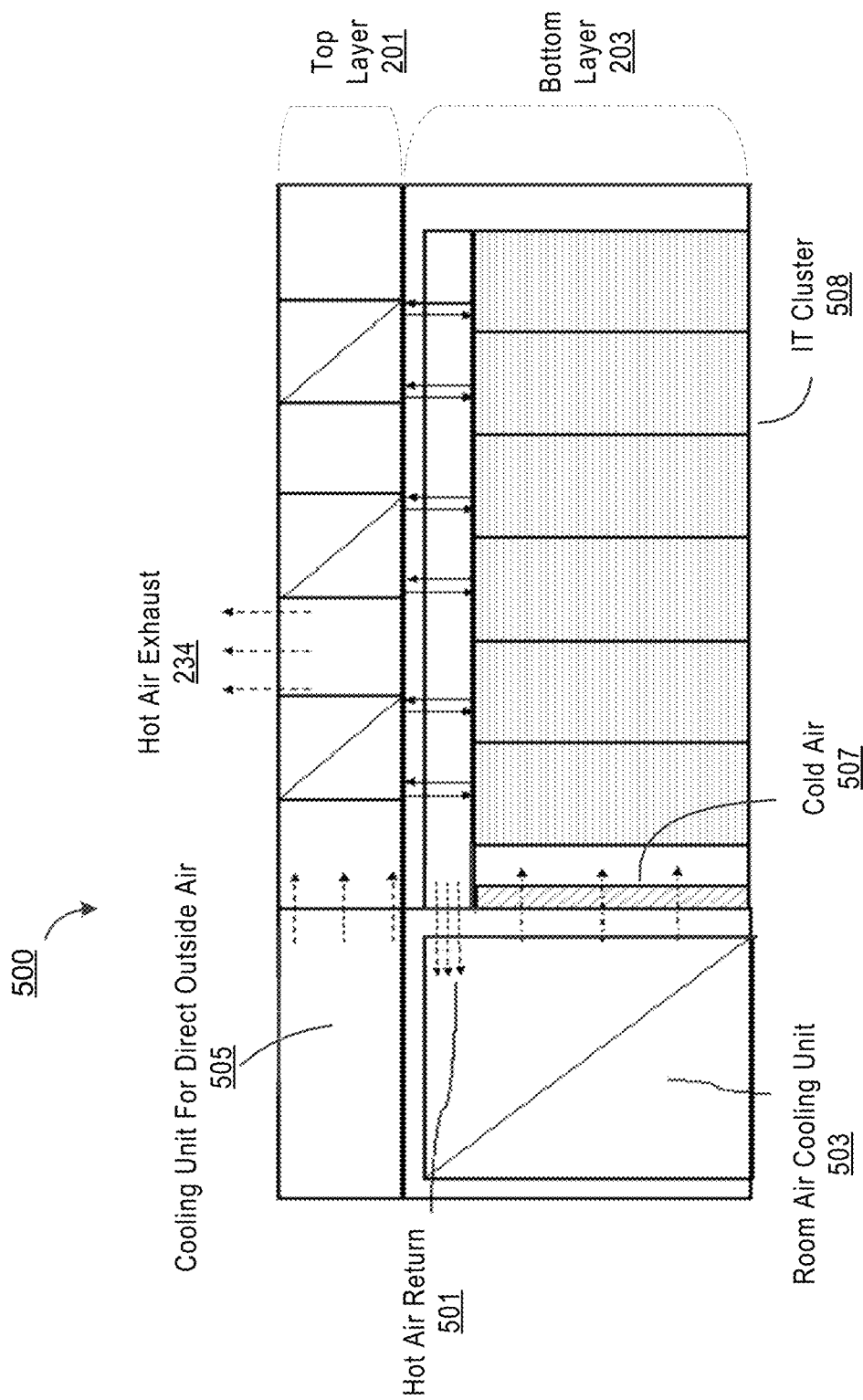
FIG. 5 shows a design of the airflow management system according to one embodiment.

FIG. 5 shows a design of the airflow management system 500 according to one embodiment. More specifically, this embodiment shows a design of cooling infrastructures in the airflow management system.

In one embodiment, the system includes separate air sources. The top layer 201 includes a cooling unit for direct outside air 505, which is used to draw outside fresh air into the cooling unit 505, and pump the fresh outside fresh air to the top layer 201. The cooling unit 505 does not necessary to cool the fresh outside air, and instead, it may function as a fan system only. The bottom layer 203 includes a room air cooling unit 503, which is used to supply cooling air to an IT cluster region 508 in the data center. The cooling air used by the room air cooling unit 503 cooling air is recirculated in the data center. The room air cooling unit 503 can also receive hot air generated by the data center, cool it again, and blow it into the IT cluster 508 again. In this design, there can be two air streams. One of the air streams is formed by cooling air coming out of the room air cooling unit 503 and the return hot air 501. The other airstream is formed by cooling air coming out of the cooling unit for direct outside air 505 and the hot air coming out of the hot air exhaust 234. The two airflows can be operated and configured independently.

As shown, the top layer 201 can have its own hot air exhaust 234, through which hot air generated by the top layer 201 is discharged into the surrounding environment of the data center, for example, outside the building houses the data center. The bottom layer 203 also has its own hot air return 501. However, instead of discharging the hot air into the outside environment as the hot air exhaust 234 of the top layer 201, the hot air return 501 discharges the hot air back into the room air cooling unit 503, where the hot air is cooled into cold air 507, which is recirculated back into the IT cluster 508.

Figure 6:
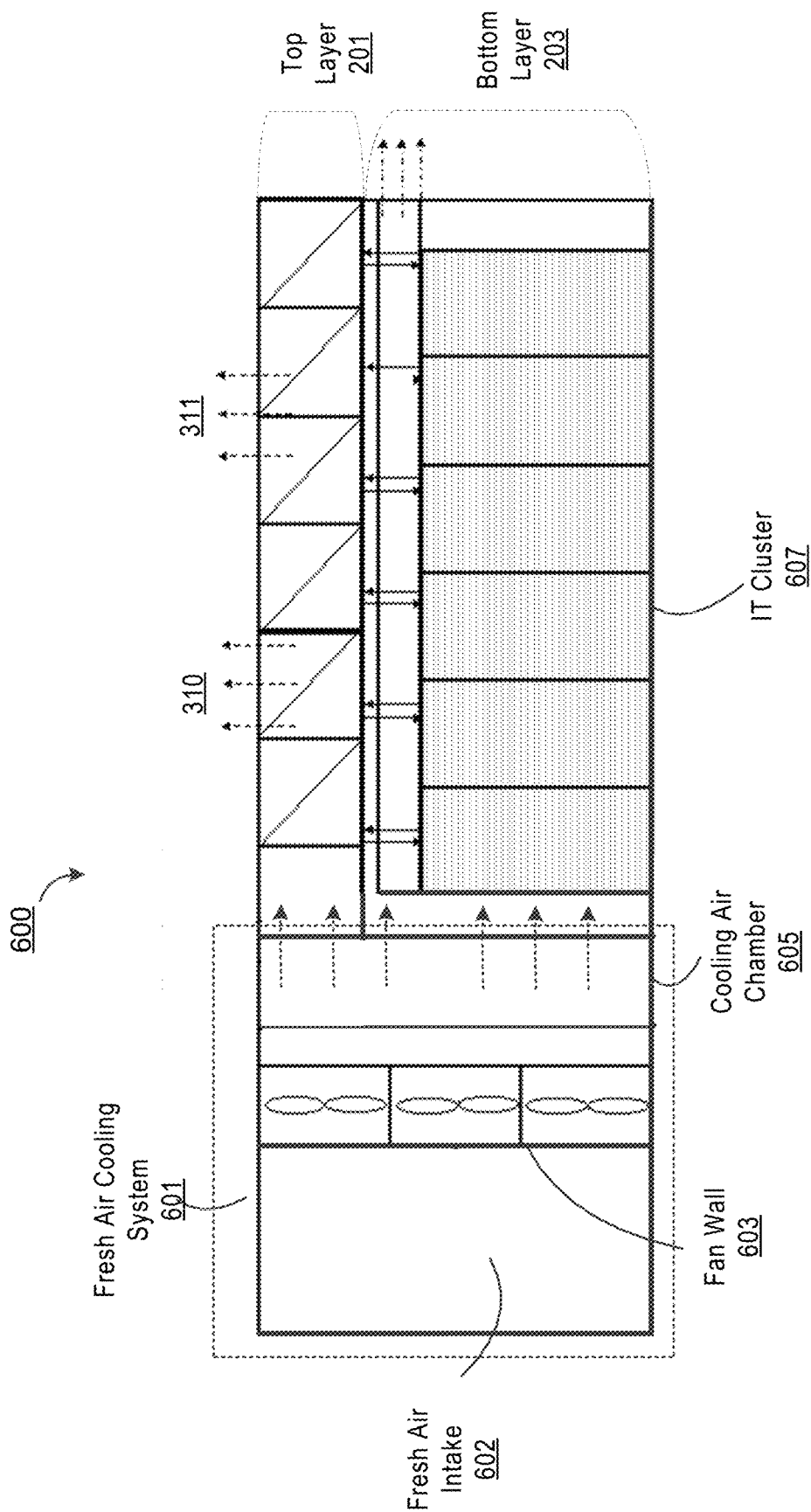
FIG. 6 shows another design of the airflow management system according to one embodiment.

FIG. 6 shows another design of the airflow management system 100 according to one embodiment. In this embodiment, the airflow management system includes a single air source to supply fresh air to a fresh air cooling system 601, which uses only fresh air, and does not use recirculated air. An IT cluster 607 is attached to the fresh air cooling system 601. The fresh air cooling system 601 can include a fresh air intake 602, a fan wall 603, and a cooling air chamber 605. The cooling air chamber 605 can be adjusted to generate different pressure conditions and distribution patterns within the chamber to supply different amounts of air to the top layer 201 and the bottom layer 203.

Figure 7:
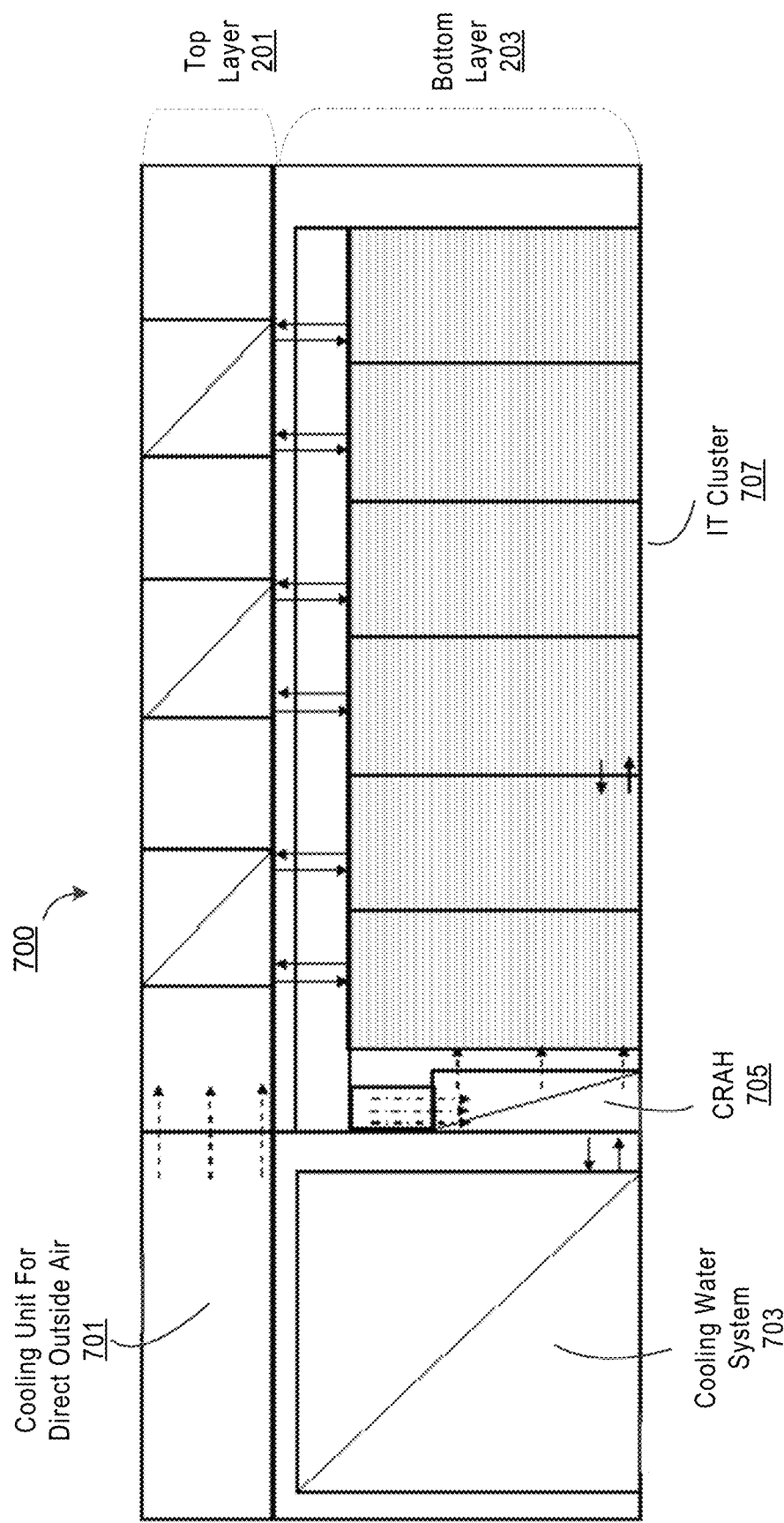
FIG. 7 shows another embodiment of the airflow management system according to one embodiment.

FIG. 7 shows another embodiment of the airflow management system 100 according to one embodiment. This embodiment uses a hybrid airflow management system that includes different types of cooling systems.

The top layer 201 uses a cooling unit for direct outside air 701, while the bottom layer 203 uses a combination of a traditional chilled water system 703 and a computer room air handler (CRAH) unit 705. The CRAH unit 705 is located within the IT cluster region 707 for conditioning and recirculating the internal airflow. The CRAH unit 705 can use fans and chilled water coils to remove heat. Because the CRAH unit 705 may not have compressors and therefore can consume less energy. The cooling water system 703 is used to supply chilled water to the CRAH unit 705. Other types of cooling systems or cooling schemes for the data center can be integrated with the bottom layer for the purpose of recirculating and conditioning airflow to the bottom layer, while the top layer can be designed using direct free air cooling in various embodiments.

Figure 8:
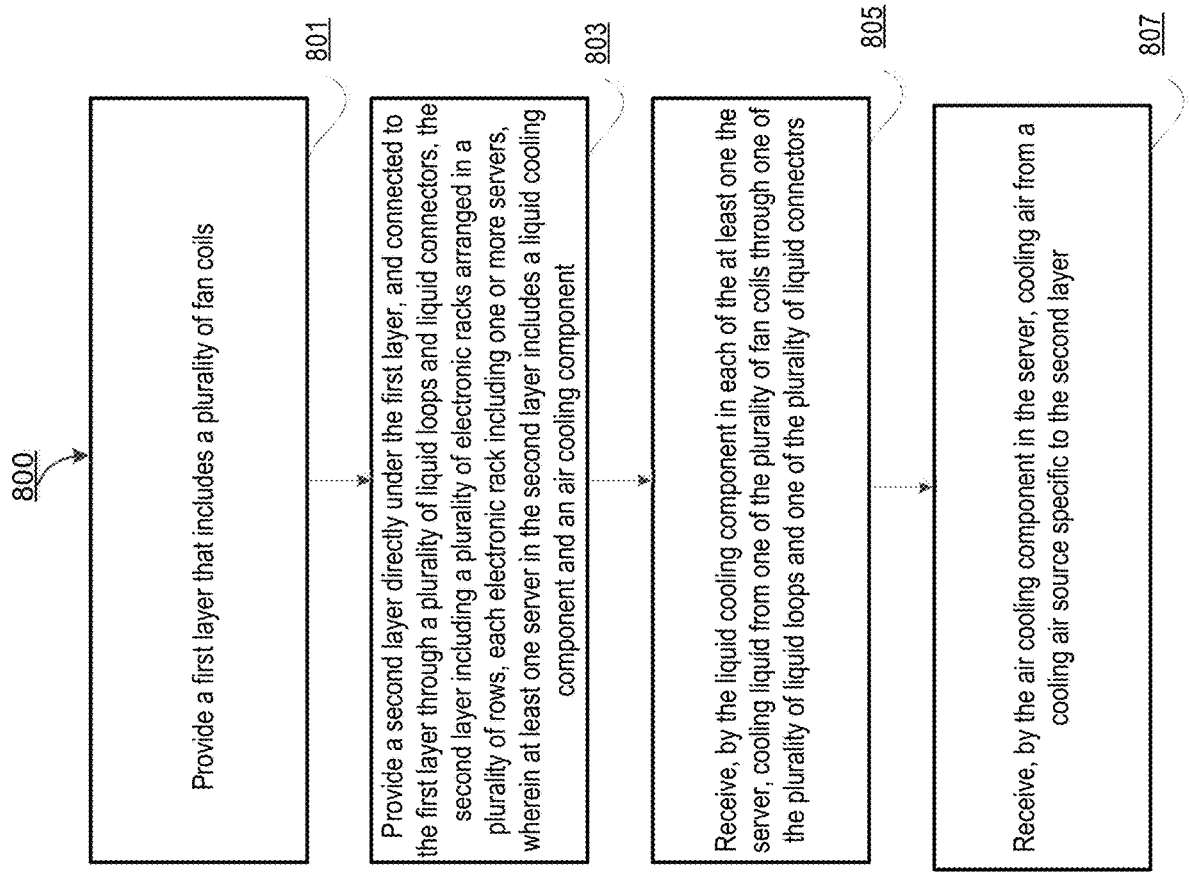
FIG. 8 illustrates a method of managing airflow in a data center according to one embodiment.

FIG. 8 illustrates a method of managing airflow in a data center according to one embodiment. As shown in FIG. 8, in block 801, a first layer, which is a drop ceiling air plenum, is provided. The drop ceiling; air plenum includes multiple fan coils that are arranged in either a cold aisle containment fashion or a hot aisle containment fashion. In block 803, a second layer is provided. The second layer represents an information technology (IT) cluster, which includes multiple electronic racks arranged either a cold aisle containment fashion or a hot aisle containment fashion. Each electronic rack includes one or more servers, and at least one server in the second layer includes a liquid cooling component and an air cooling component. The second layer is directly under the first layer, and is connected to the first layer through liquid loops and liquid connectors. In block 805, the liquid cooling component in each of the at least one the server receives cooling liquid from a fan coil through one of the liquid loops and one of the liquid connectors. In block 805, the air cooling component in the server receives cooling air from a cooling air source specific to the second layer.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

As previously explained, an embodiment of the disclosure may be (or include) a non-transitory machine-readable medium (such as microelectronic memory) having stored thereon instructions, which program one or more data processing components (generically referred to here as a "processor") to perform airflow management operations, such as controlling fan speed of one or more fans of the battery module (and/or BBU shelf). In other embodiments, some of these operations might be performed by specific hardware components that contain hardwired logic. Those operations might alternatively be performed by any combination of programmed data processing components and fixed hardwired circuit components of any of the battery modules described herein.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. An airflow management system for cooling a data center, comprising:
   a first layer that includes a plurality of fan coils; and
   a second layer under the first layer, and connected to the first layer through a plurality of liquid loops and a plurality of liquid connectors, the second layer including a plurality of electronic racks arranged in a plurality of rows, each electronic rack including one or more servers,
   wherein at least one server in the second layer includes a liquid cooling component and an air cooling component, and
   wherein the liquid cooling component receives cooling liquid from one of the plurality of fan coils through one of the plurality of liquid loops and one of the plurality of liquid connectors, and the air cooling component receives cooling air from a fresh air cooling system, wherein the fresh air cooling system is attached to the first layer and the second layer to cool both the first layer and the second layer, wherein the fresh air cooling system includes a fresh air intake, a fan wall, a filtration layer, and a cooling air chamber, and wherein the cooling air chamber is configured to generate different pressures and distribution patterns within the cooling air chamber to supply different amounts of air to the first layer and the second layer.

2. The airflow management system of claim 1, wherein each of the one or more servers is placed on one of the plurality of electronic racks, the electronic rack further including a liquid distribution unit that receives the cooling liquid from one of the plurality of fan coils and distributes the received cooling liquid to the liquid cooling component in the server.

3. The airflow management system of claim 1, wherein the first layer is a drop ceiling air plenum.

4. The airflow management system of claim 1, wherein the cooling liquid is circulated between the liquid cooling component and the one of the plurality of fan coils.

5. The airflow management system of claim 1, wherein the fresh air cooling system uses only fresh air, and does not use recirculated air.

6. The airflow management system of claim 1, wherein the plurality of fan coils in the first layer are arranged in one of a cold aisle containment fashion or a hot aisle containment fashion.

7. A method of managing airflow in a data center, comprising:
- providing a first layer that includes a plurality of fan coils;
- providing a second layer that is directly under the first layer and connected to the first layer through a plurality of liquid loops and a plurality of liquid connectors, the second layer including a plurality of electronic racks arranged in a plurality of rows, each electronic rack including one or more servers, wherein at least one server in the second layer includes a liquid cooling component and an air cooling component;
- receiving, by the liquid cooling component in each of the at least one the server, cooling liquid from one of the plurality of fan coils through one of the plurality of liquid loops and one of the plurality of liquid connectors; and
- receiving, by the air cooling component in the server, cooling air from a fresh air cooling system, wherein the fresh air cooling system is attached to the first layer and the second layer to cool both the first layer and the second layer, wherein the fresh air cooling system includes a fresh air intake, a fan wall, a filtration layer, and a cooling air chamber, and wherein the cooling air chamber is configured to generate different pressures and distribution patterns within the cooling air chamber to supply different amounts of air to the first layer and the second layer.

8. The method of claim 7, wherein each of the one or more servers is placed on one of the plurality of electronic racks, the electronic rack further including a liquid distribution unit that receives the cooling liquid from one of the plurality of fan coils, and distributes the received cooling liquid to the liquid cooling component in the server.

9. The method of claim 7, wherein the first layer is a drop ceiling air plenum.

10. The method of claim 7, wherein the cooling liquid is circulated between the liquid cooling component and the one of the plurality of fan coils.

11. The method of claim 7, wherein the fresh air cooling system uses only fresh air, and does not use recirculated air.

12. The method of claim 7, wherein the plurality of fan coils in the first layer are arranged in one of a cold aisle containment fashion or a loot aisle containment fashion.

13. The method of claim 7, wherein each of the plurality of fan coils in the first layer corresponds to each of the plurality of electronic racks in the second layer.

14. The method of claim 7, wherein the first layer further includes a plurality of hot air exhausts.

* * * * *